United States Patent
Manstretta et al.

(10) Patent No.: US 7,994,865 B1
(45) Date of Patent: Aug. 9, 2011

(54) EVEN ORDER DISTORTION CANCELLATION IN SINGLE-ENDED INPUT, DIFFERENTIAL OUTPUT AMPLIFIERS USING FEEDBACK

(75) Inventors: Danilo Manstretta, Stradella (IT); Fernando De Bernardinis, Pavia (IT)

(73) Assignee: Marvell International Ltd., Hamilton (BM)

( * ) Notice: Subject to any disclaimer, the term of this patent is extended or adjusted under 35 U.S.C. 154(b) by 40 days.

(21) Appl. No.: 12/163,405

(22) Filed: Jun. 27, 2008

Related U.S. Application Data

(60) Provisional application No. 60/946,497, filed on Jun. 27, 2007.

(51) Int. Cl.
*H03F 3/04* (2006.01)

(52) U.S. Cl. ........................................ 330/301; 330/149
(58) Field of Classification Search ................... 330/301, 330/151, 149; 333/25–26
See application file for complete search history.

(56) References Cited

U.S. PATENT DOCUMENTS 7,626,472 B2 * 12/2009 Davies-Venn et al. .......... 333/26
2003/0214356 A1 * 11/2003 Cowley et al. ................ 330/254

OTHER PUBLICATIONS

An IP2 Improvement Technique for Zero-IF Down-Converters, 2006 IEEE International Solid-State Circuits Conference; ISSCC 2006 / Session 25 / RF/IF Circuits / 25.7; Entire Document.

* cited by examiner

*Primary Examiner* — Hieu P Nguyen

(57) ABSTRACT

An amplifier and a method for converting a single ended signal to an amplified differential signal. The amplifier comprises an input configured to receive a single ended signal, a differential amplifier that outputs an amplified differential signal based on the single ended signal, and a compensator coupled to the differential amplifier and configured to inject an adjusted distortion compensating signal based on the even order distortion signal to compensate for a distortion in the amplified differential signal. The method comprises receiving a single ended signal, converting the single ended signal to an amplified differential signal, and generating a distortion compensating signal to substantially cancel an even order distortion signal injected to the differential signal by the converting.

24 Claims, 11 Drawing Sheets

EVEN ORDER DISTORTION CANCELLATION IN SINGLE-ENDED INPUT, DIFFERENTIAL OUTPUT AMPLIFIERS USING FEEDBACK

CROSS REFERENCE TO PRIOR APPLICATIONS

This application claims priority and the benefit thereof from a U.S. Provisional Application No. 60/946,497 filed on Jun. 27, 2007, which is hereby incorporated by reference for all purposes as if fully set forth herein.

BACKGROUND

1. Field

This disclosure relates to a method, a circuit and a system for mitigating distortion in single-ended input to differential output circuits.

2. Related Art

In many applications, it is desirable to use differential signals instead of single-ended signals. Differential signals typically result in better control of receiver circuitry, faster circuits and lower power consumption. However, signals are often generated and initially transmitted as unbalanced single ended signals. Accordingly, converters, sometimes referred to as "baluns" (balanced-unbalanced converters), that convert an unbalanced single-ended signal to a pair of amplified balanced differential signals may be used.

In integrated circuits, passive baluns, which may be configured as a wire wrapped around a core, may be costly, complex and unsuitable for wide bandwidth applications. Conversely, conventional active baluns, which may be configured as an active conversion circuit, are non-linear, cause unfavorable power dissipation and introduce undesirable distortion in the differential signals.

SUMMARY

In one aspect of the invention, an amplifier is provided for converting a single ended signal to an amplified differential signal, the amplifier comprising: an input configured to receive a single ended signal; a converter that outputs an amplified differential signal based on the single ended signal; and a compensator coupled to the converter and configured to receive an even order distortion signal and feedback an adjusted distortion compensating signal to compensate for a distortion in the amplified differential signal. The amplifier may further comprise a summer coupled between an output of the compensator and an input of the converter.

The compensator comprises an extractor configured to receive the amplified differential signal and extract a compensating level signal. The compensator further may comprise an optional gain adjuster configured to generate the adjusted distortion compensating signal based on the compensating level signal. The adjusted distortion compensating signal may comprise the compensating level signal. The compensator may be further configured to generate the adjusted distortion compensating signal by adding the amplified differential signal and multiplying a result of the summing by a predetermined gain. The predetermined gain may comprise a one-half gain.

The gain adjuster may be further configured to: receive the compensating level signal from the extractor; and generate the adjusted distortion compensating signal based on the compensating level signal.

A component of the adjusted distortion compensating signal may be added to an output of the converter. Another component of the adjusted distortion compensating signal may be added to another output of the converter. The converter may comprise two inputs configured to receive a differential signal; and two outputs configured to output said amplified differential signal. The adjusted distortion compensating signal may comprise a pair of adjusted distortion compensating signal components. The adjusted distortion compensating signal may be added to the single ended signal. A signal transfer function of the single ended signal may be unaffected by operation of the amplifier. The amplifier may further comprise a loop gain substantially equal to zero. The amplified differential signal may be substantially linear to the single ended signal.

The amplifier may further comprise: a first summer coupled between an output of the converter and the compensator; and a second summer coupled between another output of the converter and the compensator, wherein the compensator is further configured to output one of the pair of adjusted distortion compensating signal components to the first summer, and the other of the pair of adjusted distortion compensating signal components to the second summer.

According to another aspect of the disclosure, a method is provided for mitigating second order distortion when converting a single ended signal to a pair of differential signals. The method comprises: receiving a single ended signal; converting the single ended signal to an amplified differential signal; and generating an adjusted distortion compensating signal to substantially cancel an even order distortion signal injected to the differential signal by the converting. The method may further comprise: summing the distortion compensating signal to the received single ended signal; adding the amplified differential signal; varying a gain of a result of the adding by a predetermined gain value; providing a compensating level signal based on the varying; adding the adjusted distortion compensating signal to the amplified differential signal; and/or adding the adjusted distortion compensating signal to the single ended signal. The adding may comprise: adding a component of the adjusted distortion compensating signal to a component of the amplified differential signal; and adding a second component of the adjusted distortion compensating signal to a second component of the amplified differential signal. The predetermined gain value may comprise a one-half gain. The adjusted distortion compensating signal may be generated based on the compensating level signal. The adjusted distortion compensating signal may comprise the compensating level signal. A signal transfer function of the single ended signal may be unaffected by the converting. The method may further comprise: maintaining a loop gain at substantially equal to zero; and/or maintaining substantially linearity between the amplified differential signal and the single ended signal.

According to a yet further aspect of the disclosure, a method is provided for mitigating second order distortion when amplifying a pair of differential signals to a pair of amplified differential signals, the method comprising: receiving a pair of differential signal components; amplifying the pair of differential signal components to a pair of amplified differential signal components; and generating an adjusted distortion compensating signal to substantially cancel an even order distortion signal injected in at least one of the pair of amplified differential signal components by the amplifying.

According to a still yet further aspect of the disclosure, a communication device is provided that comprises the amplifier according to the disclosure. The communication device may comprise a high definition television.

Additional features, advantages, and embodiments of the disclosure may be set forth or apparent from consideration of the following detailed description, drawings, and claims. Moreover, it is to be understood that both the foregoing summary of the disclosure and the following detailed description are examples and are intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION

Figure 1A:
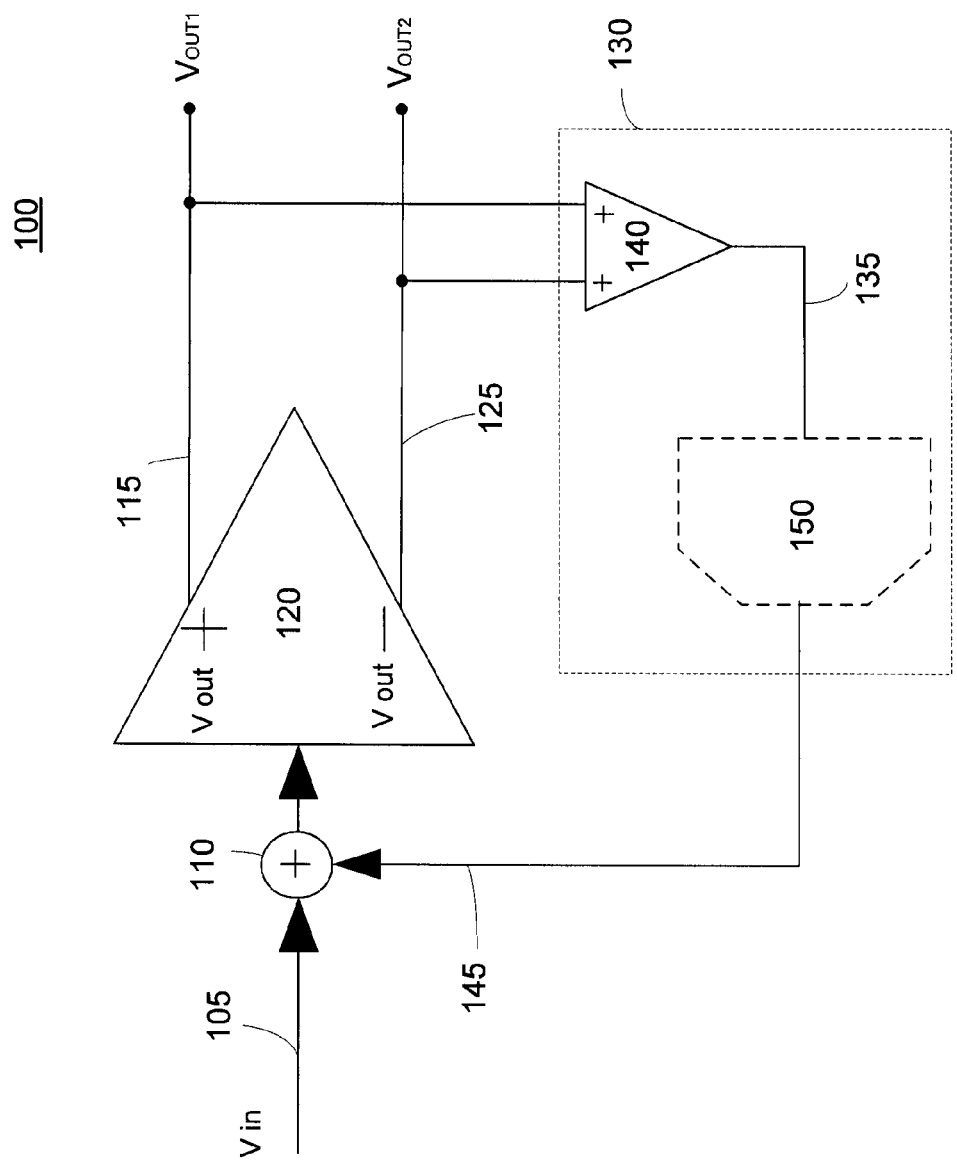
FIG. 1A shows an example of an active conversion circuit according to an embodiment of the disclosure.

The embodiments of the disclosure and the various features and details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure teaching principles of the disclosed embodiments. The examples used herein are intended merely to facilitate an understanding of ways in which the disclosure may be practiced and to further enable those of skill in the art to practice disclosed the embodiments. Accordingly, the examples and embodiments herein should not be construed as limiting. Moreover, it is noted that like reference numerals represent similar parts throughout the several views of the drawings.

FIG. 1 shows an example of an active conversion circuit 100 for converting a single ended input signal $V_{in}$ to a pair of differential signal components outputted on outputs $V_{OUT1}$, $V_{OUT2}$, according to an embodiment of the disclosure. In the circuits shown, the active conversion circuit 100 is arranged so that a signal transfer function of a single ended analog input signal $V_{in}$ remains unaffected, such as, for example, the input to output signal transfer function. The circuit 100 may have a loop gain of approximately zero. Moreover, the circuit 100 may provide linearity between the pair of differential signal components outputted on outputs $V_{OUT1}$, $V_{OUT2}$ and the single ended input signal $V_{in}$ received by the circuit.

As seen in FIG. 1A, the circuit 100A may include a summer 110, a converter 120 and a compensator 130. An input of the summer 110 may be connected to a voltage source (such as, e.g., a voltage source $V_s$, shown in FIG. 8) via a line 105 to receive the single-ended analog input signal $V_{in}$. The summer 110 may include a second input that may be connected to an output of the compensator 130 via a line 145. As seen in FIG. 1A, the summer 110 includes a second input connected to the line 145. An output of the summer 110 may be connected to an input of the converter 120. The summer 110 may include, for example, but is not limited to, a summing junction or an integrated circuit (IC) capable of summing at least two signals, without departing from the scope or spirit of the disclosure.

The converter 120 may include a pair of outputs $V_{OUT1}$, $V_{OUT2}$, on which a pair of differential signals $V_{out+}$, $V_{out-}$, respectively, may be output through a pair of lines 115, 125, respectively, as $V_{out+}$, $V_{out-}$. The converter 120 may include one or more single-input to dual-output amplifiers, which receive a single-ended (unbalanced) analog signal and convert the signal to a pair of differential (balanced) output signals. Additionally (or alternatively), the converter 120 may include at least one differential amplifier that receives multiple input signals and provides multiple output signals. For example, the converter 120 may include a differential amplifier that includes a pair of inputs for receiving a pair of differential component signals and a pair of outputs for outputting a pair of amplified differential component signals (as discussed below with reference to FIG. 1B).

During operation of the conversion circuit 100, the converter 120 may output the differential signals $V_{out+}$, $V_{out-}$, a pair of common mode signals CM1, CM2 and an even order differential distortion signal DFA on the differential signal output lines 115, 125. Typically, the even order differential distortion signal DFA may be output on the output line 125. The even order differential distortion signal DFA may comprise a pair of differential distortion component signals DF1, DF2, having substantially equal amplitudes and frequencies, but substantially opposite polarities. The common mode signals CM1, CM2 and the differential distortion signal DFA may be generated in the converter 120 as a result of, for example, the operation of internal components, such as, e.g., transistors, switches, and the like.

Figure 2:
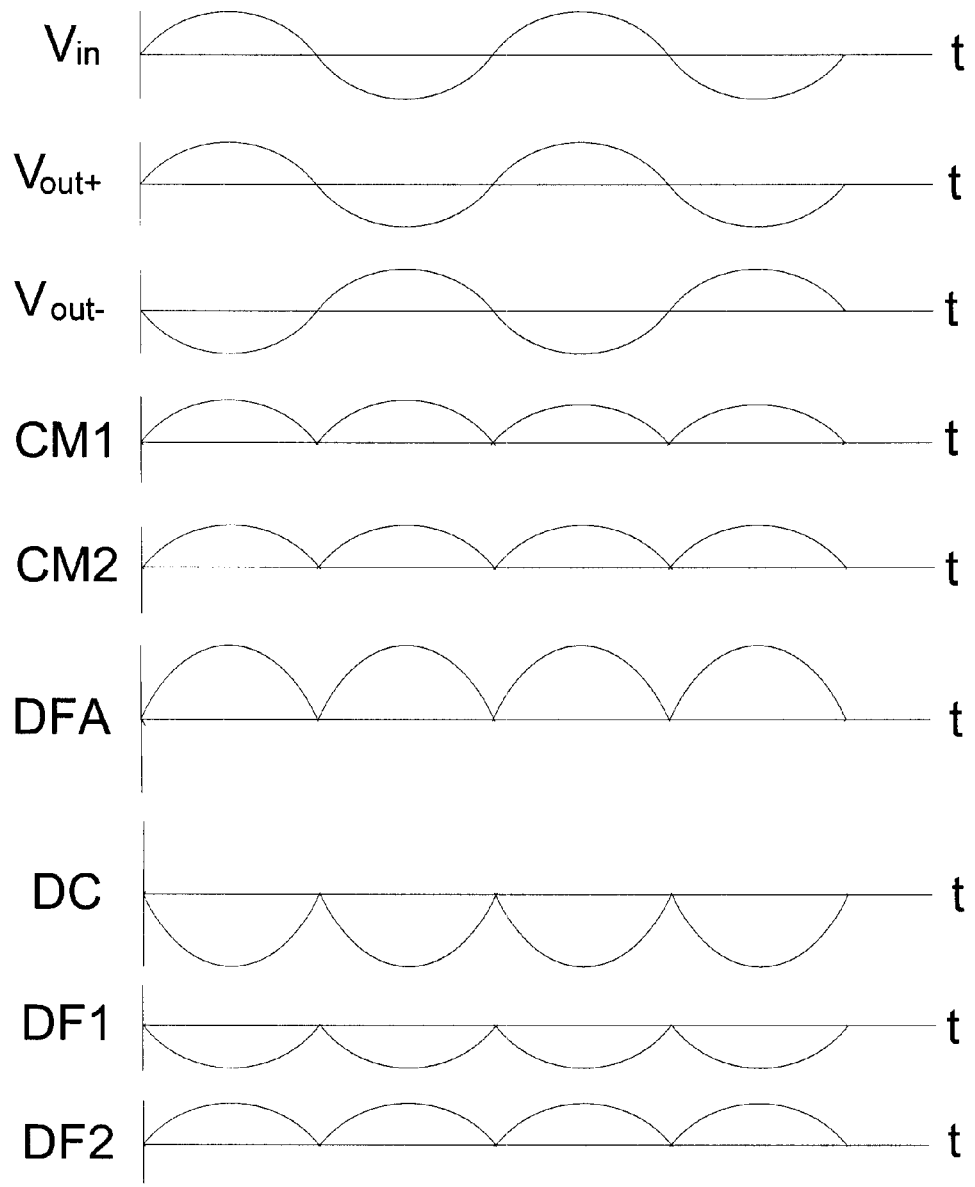
FIG. 2 shows various waveform diagrams for various signals that may appear in different portions of the active conversion circuit according to the disclosure.

FIG. 2 shows various waveform diagrams for the various signals, including waveform diagrams for the signals $V_{in}$, $V_{out+}$, $V_{out-}$, CM1, CM2, DFA, DC, DF1 and DF2, which may appear in different portions of the active conversion circuit 100 with respect to time, as discussed below.

Referring to FIGS. 1A and 2, the converter 120 may output the signals $V_{out+}$ and CM1 on the line 115. Further, the converter 120 may output the signals $V_{out-}$, CM2 and DFA on the line 125. As noted earlier, the signal DFA comprises differential distortion component signals DF1 and DF2. The compensator 130 may include a pair of inputs connected to the output lines 115, 125, for receiving the signals $V_{out+}$, $V_{out-}$, CM1, CM2, DFA, which may be output from the converter 120. The compensator 130 includes an extractor 140 and an optional gain adjuster 150. The extractor 140 may include, for example, a dual-input to single-output amplifier, integrated circuit, or the like, that receives the signals from lines 115, 125, and adds the signals to extract the differential distortion signal DFA.

The extractor 140 may output an adjusted distortion compensating signal DC on a line 145, when the optional gain adjuster 150 is not included in the compensator 130; or, the extractor 140 may output a compensating level signal (not shown) when the optional gain adjuster 150 is included in the compensator 130. In the latter instance, the compensating level signal may be applied to an input of the optional gain adjuster 150 through a line 135, which then may variably adjust a magnitude of the compensating level signal to provide the adjusted distortion compensating signal DC. The optional gain adjuster 150 may include, for example, one or more regulating amplifiers or linearizing amplifiers, including a single-input to single-output integrated circuit amplifier.

The extractor 140 may include a variable gain, such as, e.g., a one-half (½) gain (or any other appropriate gain) to vary the magnitude of the extracted differential distortion signal DFA and to provide the adjusted distortion compensating signal DC that substantially balances (or cancels) the even order differential distortion signal DFA introduced by, for example, the converter 120, which may appear at the output $V_{OUT2}$.

As seen in FIG. 1A, the compensator 130 may further include the optional gain adjustor 150. The optional gain adjustor 150 may be configured to receive the compensating level signal from the extractor 130 over the line 135 and vary the magnitude of the compensating level signal to generate the adjusted distortion compensating signal DC, which substantially balances (or cancels) the even order differential distortion signal DFA introduced by, for example, the converter 120, which may appear at the output $V_{OUT2}$.

Further, a gain of the extractor 140 and/or the optional gain adjustor 150 may be variable or fixed. For example, where the gain of the optional gain adjustor 150 is fixed, the gain of the extractor 140 may be variable. Where the gain of the optional gain adjustor 150 is variable, the gain of the extractor 140 may be fixed. Moreover, the gains of both the extractor 140 and the optional gain adjustor 150 may be variable. The extractor 140 and/or the optional gain adjustor 150 may provide a loop gain of approximately zero to the circuit 100. Moreover, the extractor 140 and the optional gain adjustor 150 are configured to provide linearity between the amplified differential signal and the input single-ended signal.

The compensator 130 may provide the adjusted distortion compensating signal DC to an input of the summer 110 (via the line 145) to be added to the input signal $V_{in}$, the result of which may be applied to the input of the converter 120 to substantially cancel the even order differential distortion signal DFA.

Figure 1B:
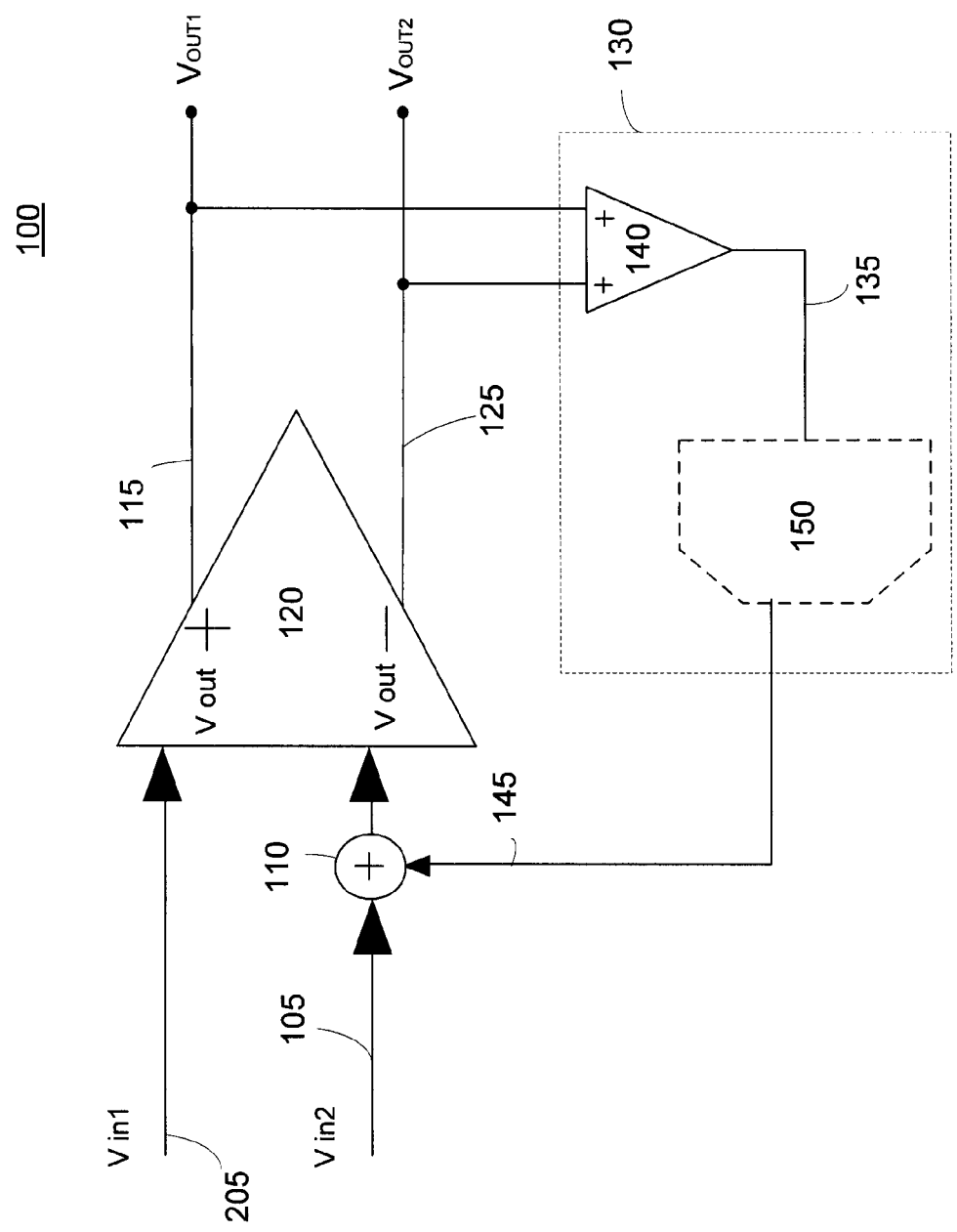
FIG. 1B shows an example of an active conversion circuit according to another embodiment of the disclosure.

FIG. 1B shows an example of an active conversion circuit 100B according to another embodiment of the disclosure. As seen in FIG. 1B, the converter 120 may include a differential amplifier that has a pair of inputs for receiving input differential component signals $V_{in1}$, $V_{in2}$ from a pair of lines 205, 105, and a pair of outputs for outputting the amplified differential component signals a $V_{OUT1}$, $V_{OUT2}$. In this instance, the adjusted distortion compensating signal (from the compensator 130) may be added to only one of the input differential component signals $V_{in1}$, $V_{in2}$ to substantially cancel the even order differential distortion signal DFA generated by the converter 120.

Figure 1C:
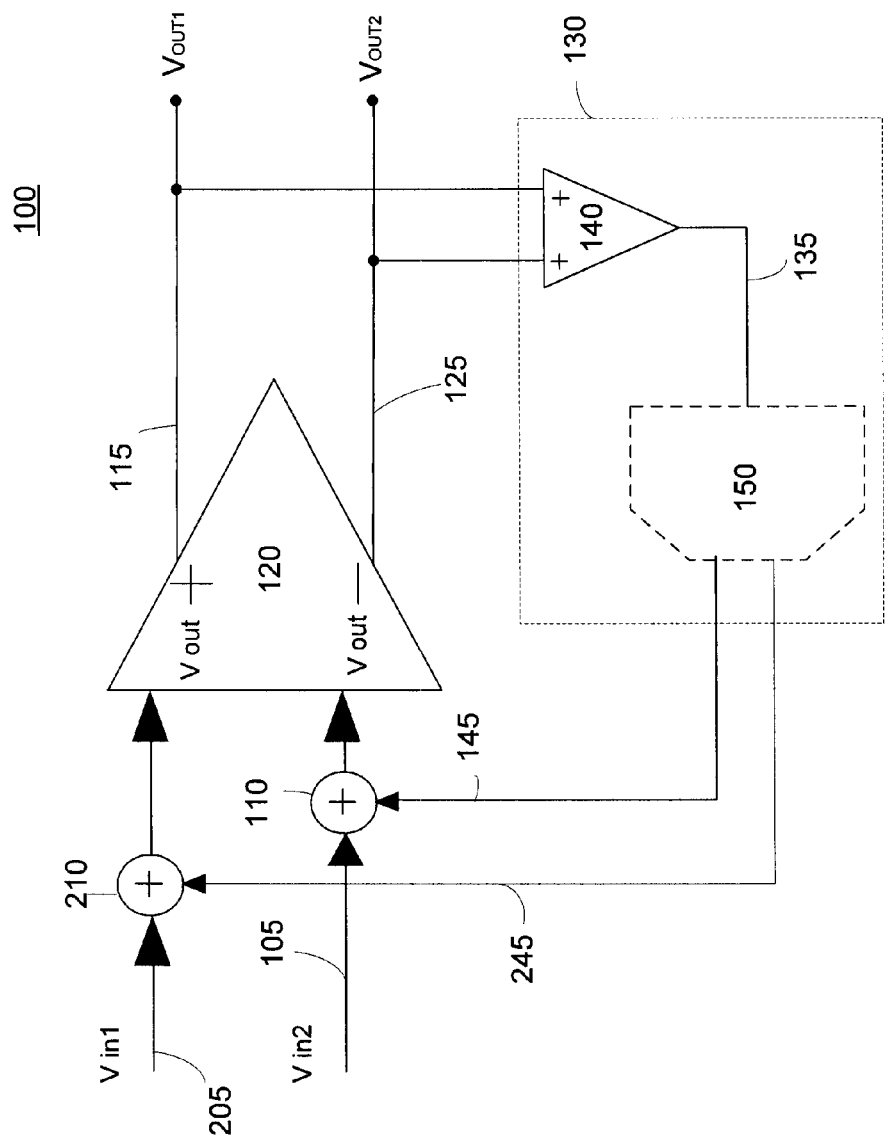
FIG. 1C shows an example of an active conversion circuit according to yet another embodiment of the disclosure.

FIG. 1C shows an example of an active conversion circuit 100C according to yet another embodiment of the disclosure. As shown in FIG. 1C, a second summer 210 may be included at an input of the converter 120. In this instance, to the adjusted distortion compensating signal (from the compensator 130) may be provided as a pair of adjusted distortion compensating component signals on the lines 145, 245, and input to the summers 110, 210, respectively. The pair of adjusted distortion compensating component signals may, thus, be added to the input differential component signals $V_{in1}$, $V_{in2}$ to substantially cancel the even order differential distortion signal DFA generated by the converter 120.

Figure 3:
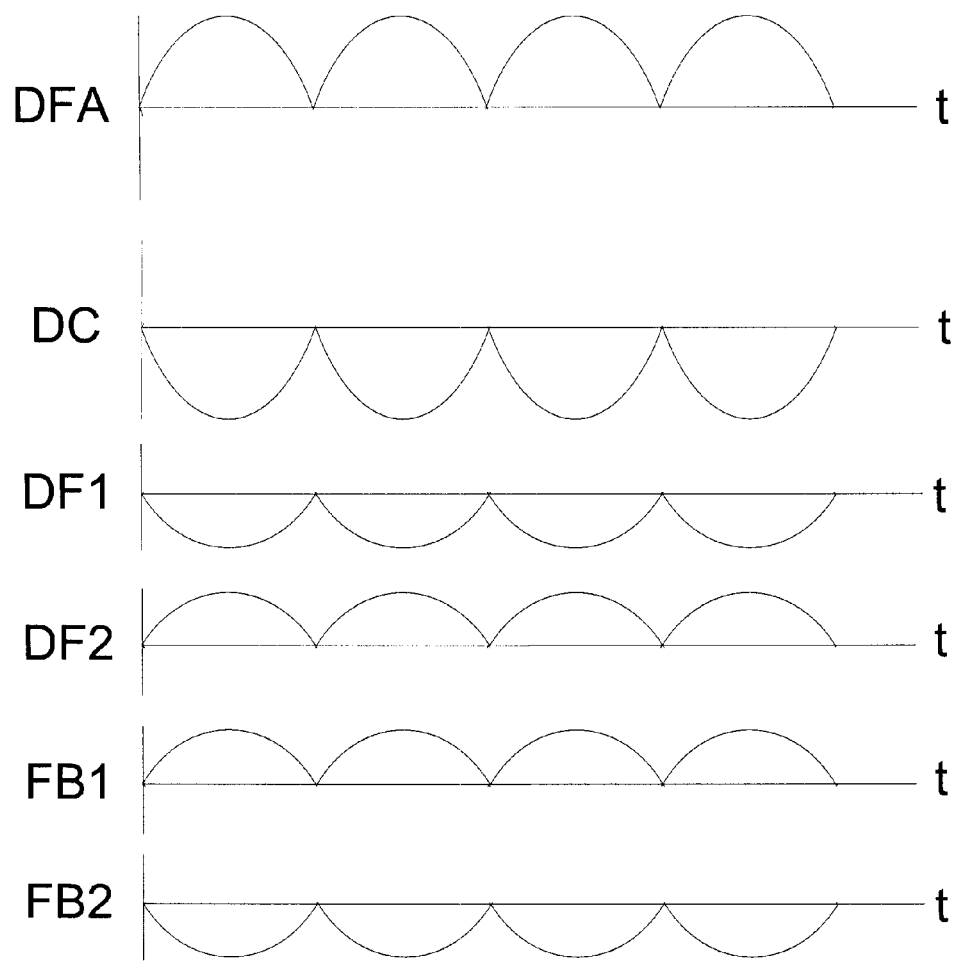
FIG. 3 shows further waveform diagrams for certain of the signals that may appear in the active conversion circuit according to the disclosure.

FIG. 3 shows the waveform diagrams for the DFA, DC, DF1 and DF2 discussed above, as well as waveform diagrams for FB1 and FB2 signals. As seen in FIG. 3, the compensator 130 may provide the adjusted distortion compensating signal DC as the pair of feedback component signals FB1, FB2 that have substantially the same frequency and substantially the same amplitude, but opposite polarities to the differential distortion component signals DF1, DF2, respectively. Hence, the feedback component signals FB1, FB2 substantially balance (or cancel) the differential distortion component signals DF1, DF2.

It is noted that the amplitudes of the distortion component signals DF1, DF2, FB1 and FB2 are all represented as having similar amplitudes to the signals $V_{out+}$, $V_{out-}$ and $V_{in}$ (which may be linear signals) so that they may be drawn clearly. In general, the amplitudes of the distortion component signals DF1, DF2, FB1 and FB2 may be much smaller than the amplitudes of the signals $V_{out+}$, $V_{out-}$ and $V_{in}$. The amplitudes of the distortion component signals DF1, DF2, FB1 and FB2 may all be equal.

Figure 4:
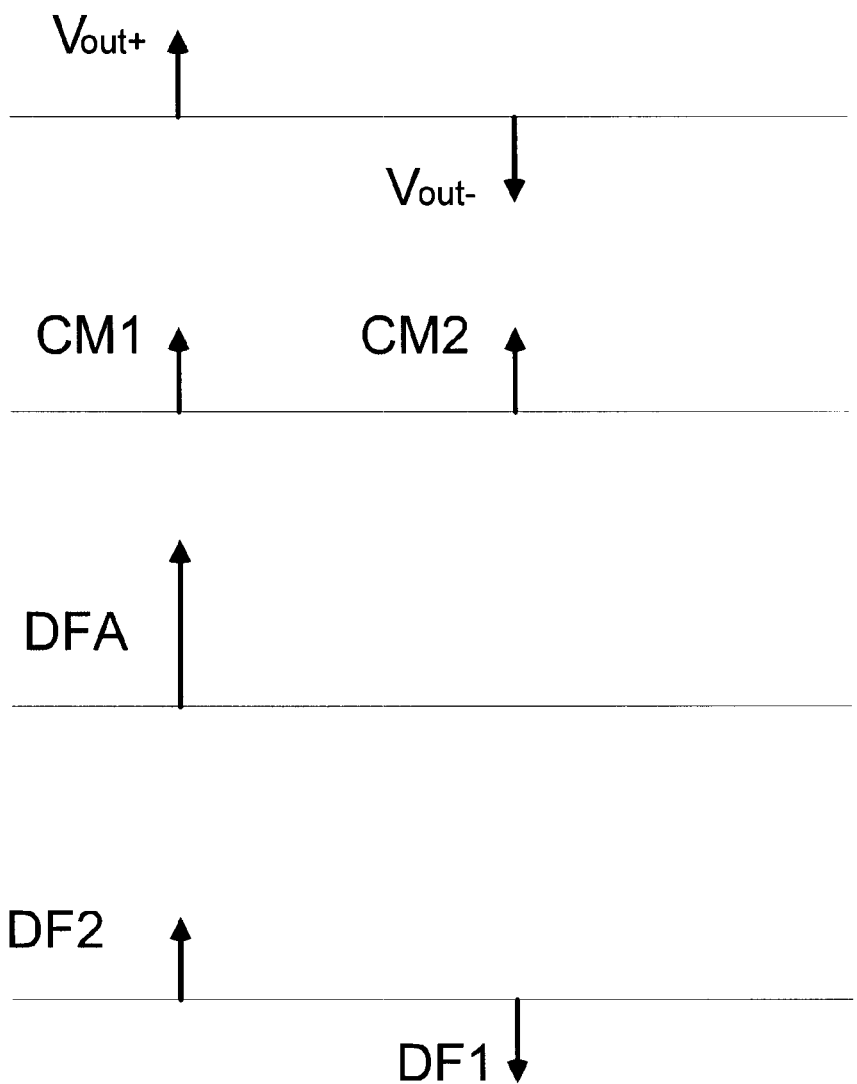
FIG. 4 shows an example of a vector diagram representation of the main frequency components of certain of the signals shown in FIGS. 2 and 3.

FIG. 4 shows an example of a vector diagram representation of the main frequency components of the signals $V_{out+}$, $V_{out-}$, CM1, CM2, DFA, DF1 and DF2, shown in FIGS. 2 and 3.

Figure 5:
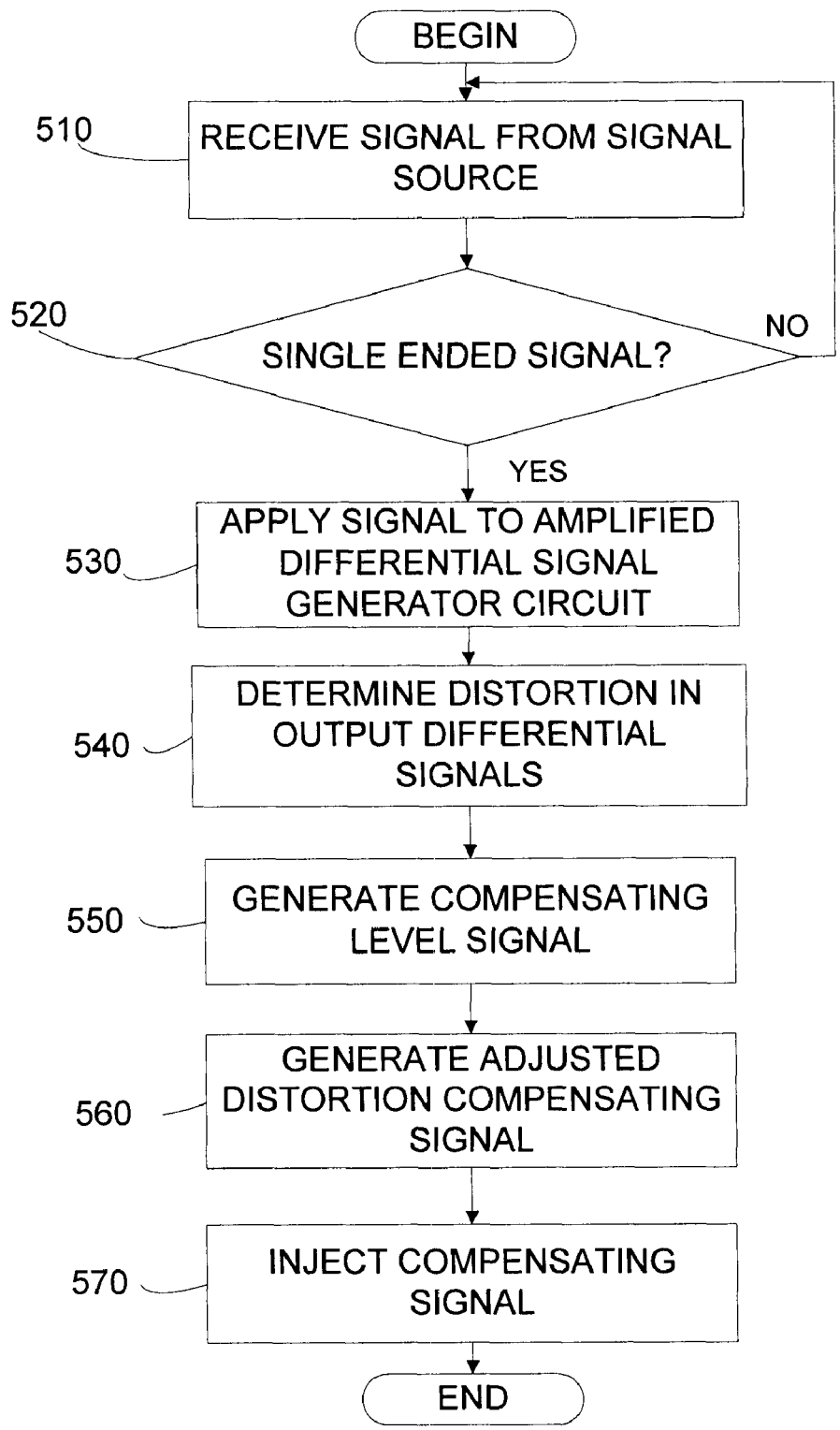
FIG. 5 shows an example of a distortion compensation process according to an embodiment of the disclosure.

FIG. 5 shows an example of a distortion compensation process that may be performed by, for example, but not limited to the active conversion circuit 100 of FIG. 1A. The process may begin upon, for example, initialization of the active conversion circuit 100. The distortion compensation process may provide for a conversion from a single-ended input signal $V_{in}$ to a differential output signal, having signal components $V_{out+}$, $V_{out-}$, while maintaining linearity between the input signal $V_{in}$ and the differential output signal.

Referring to FIG. 5, a signal $V_{in}$ may be received from a signal source (Step 510). A determination may be made whether the received signal $V_{in}$ is a single-ended sinusoidal analog signal (Step 520). If the signal $V_{in}$ is determined to be a single-ended (or unbalanced) analog signal (YES at Step 520), then the signal $V_{in}$ is applied to an amplified differential signal generator circuit (such as, e.g, the circuit 100 shown in FIG. 1A, the circuit 600 shown in FIG. 6, the circuit 700 shown in FIG. 7 or the circuit 800 shown in FIG. 8) (Step 530), which converts the received signal $V_{in}$ to a pair of amplified differential signals, otherwise the process returns (NO at Step 520) to receive another signal (Step 510).

The pair of output amplified differential signals may include a pair of output signals $V_{out+}$, $V_{out-}$, a pair of common mode signals CM1, CM2 and an even order differential distortion signal DFA. The amplified differential signals may be added by an extractor (such as, e.g., the extractor 140 in FIG. 1A) to extract the differential distortion signal DFA (Step 540). Based on the extracted differential distortion signal DFA, a compensating level signal may be generated based on a variable gain (such as, e.g., ½ gain) of the extracted signal (Step 550). The compensating level signal may then be used to generate an adjusted distortion compensating signal DC to substantially balance (or cancel) the even order differential distortion signal DFA (Step 560). The generated distortion compensating signal DC may be injected into the amplified differential signal generator circuit to substantially balance (or cancel) the even order differential distortion signal DFA, passing the common mode signals CM1, CM2 unaffected (Step 570).

Figure 6:
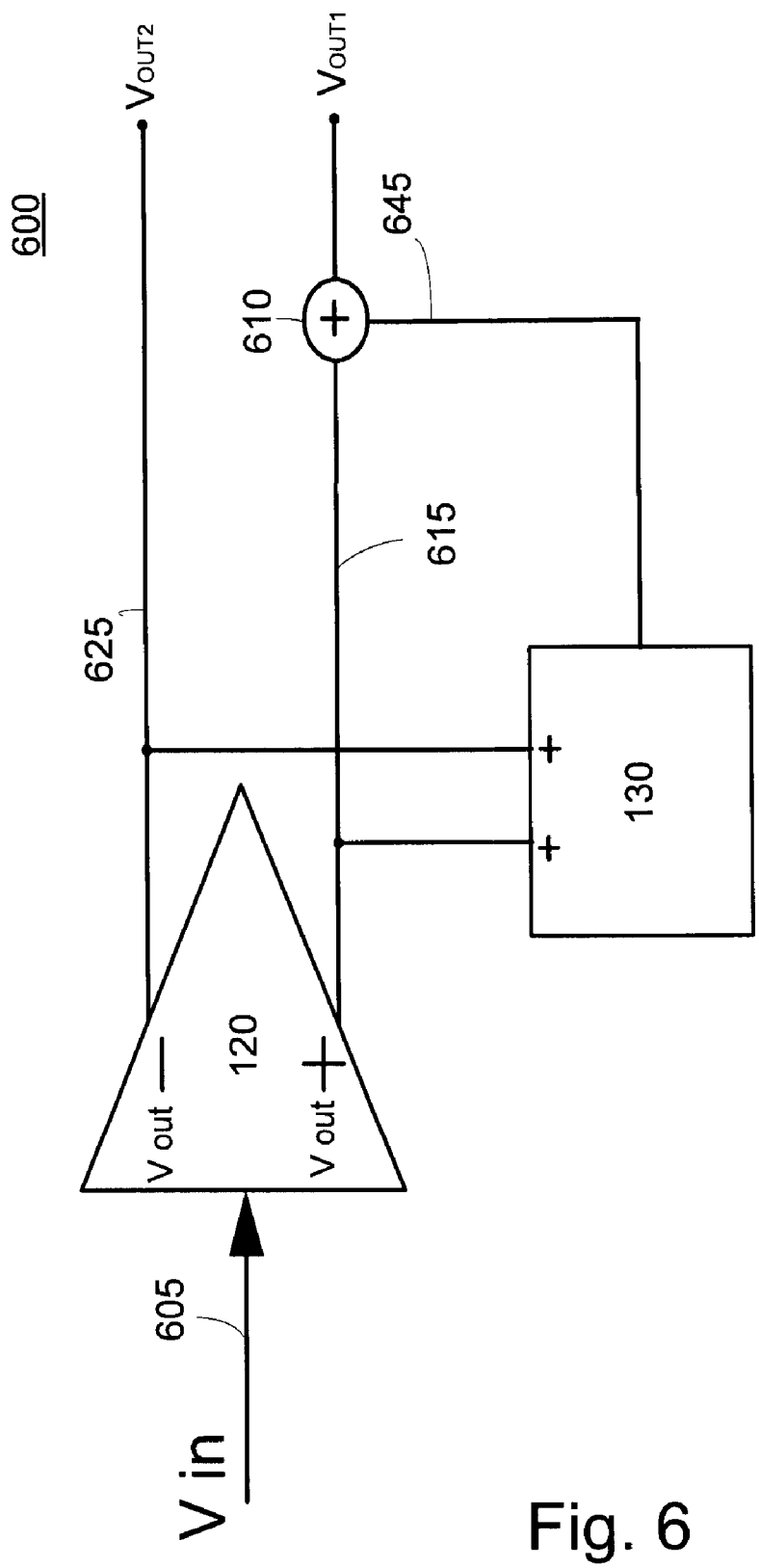
FIG. 6 shows an example of an active conversion circuit according to a further embodiment of the disclosure.

FIG. 6 shows an example of an active conversion circuit 600 for converting the single ended input signal $V_{in}$ to the pair of differential signals $V_{OUT1}$, $V_{OUT2}$, according to a further embodiment of the disclosure. It is again noted that like reference numerals represent similar parts throughout the drawings.

As seen in FIG. 6, the circuit 600 includes a summer 610, a converter 120 and a compensator 130. The circuit 600 may have a loop gain of approximately zero. In other words, the circuit 600 may be arranged so as not to modify the signal transfer function of the analog input signal.

Referring to FIG. 6, an input of the converter 120 may be connected to a voltage source $V_s$ (not shown) via a line 605 to receive the single-ended (or unbalanced) analog input signal $V_{in}$. The converter 120 converts the received single-ended analog input signal $V_{in}$ to the pair of differential (or balanced) output signals $V_{out+}$, $V_{out-}$, which are outputted at the pair of outputs $V_{OUT1}$, $V_{OUT2}$, respectively, as $V_{out+}$, $V_{out-}$. The pair of output signals $V_{out+}$, $V_{out-}$ may be output through outputs $V_{OUT1}$, $V_{OUT2}$ through a pair of lines 615, 625, respectively.

During operation of the circuit 600, the common mode signals CM1, CM2 and the differential distortion signal DFA (having differential distortion component signals DF1, DF2) may be generated in the converter 120 as a result of, for example, the operation of internal components, such as, e.g., transistors, switches, and the like.

Referring to the waveforms shown FIG. 2, the converter 120 may output the common mode signals CM1, CM2 and the differential distortion signal DFA on the output lines 615, 625. For example, the converter 120 may output the signals $V_{out+}$ and CM1 on the line 615 and the signals $V_{out-}$, CM2 and DFA on the line 625.

The summer 610 may be configured to receive one of the differential pair of output signals, e.g., $V_{out+}$, and to add a feedforward signal FF (not shown), which may be received from the compensator 130 through a line 645. An output of the summer 610 may be connected to the output $V_{OUT1}$. The feedforward signal FF may be similar to the adjusted distortion compensating signal DC discussed earlier, which has substantially the same frequency and amplitude as the differential distortion signal DFA introduced by the converter 120, thereby substantially balancing (or canceling) the differential distortion signal DFA.

The summer 610 may include, for example, but is not limited to, a summing junction or an integrated circuit (IC) capable of summing at least two signals, without departing from the scope or spirit of the disclosure.

Figure 7:
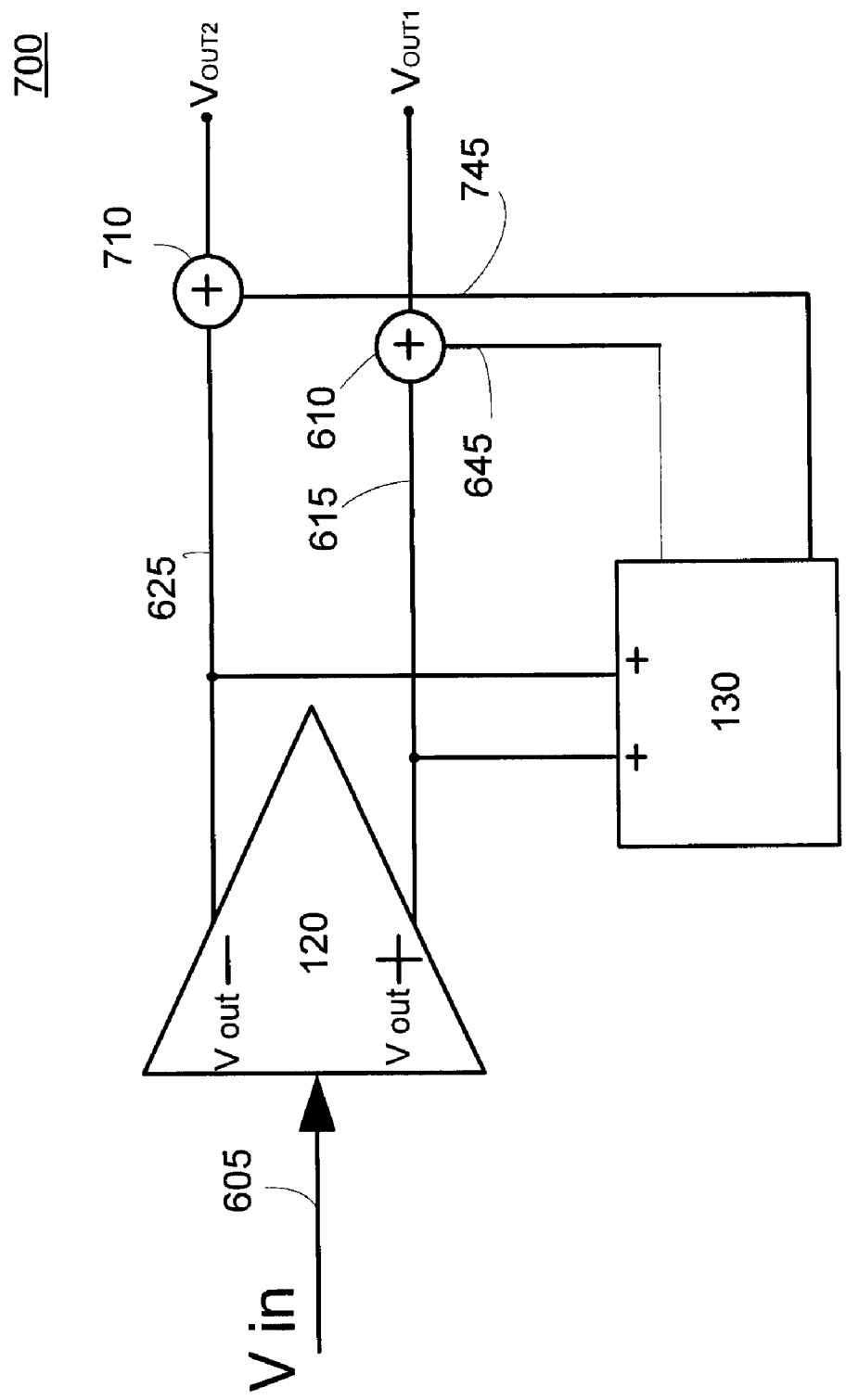
FIG. 7 shows an example of an active conversion circuit according to a yet further embodiment of the disclosure.

FIG. 7 shows an example of an active conversion circuit 700, according to a yet further embodiment of the disclosure. The circuit 700 includes a pair of summers 610, 710, the converter 120 and the compensator 130. The compensator 130 may be configured to include two outputs and a single input, as seen in FIG. 7.

The circuit 700 may be arranged so as not to affect the signal transfer function of the analog input signal. For example, the circuit 700 may have a loop gain of approximately zero.

During operation of the circuit 700, the converter 120 may output the pair of amplified differential signals, including the output signals $V_{out+}$, $V_{out-}$, the pair of common mode distortion signals CM1, CM2 and the even order differential distortion signal DFA (having a pair of differential distortion component signals DF1, DF2) on the output lines 615, 625. Referring to the waveforms shown in FIG. 2, the converter 120 may output the signals $V_{out+}$ and CM1 on the line 615 and the signals $V_{out-}$, CM2 and DFA on the line 625.

Referring to FIG. 7, further to the description provided above with respect to the active conversion circuit 600 (shown in FIG. 6), the active conversion circuit 700 may include a second summer 710. The compensator 130 may be configured to provide a pair of feedforward component signals FF1, FF2, based on the received differential signals from lines 615, 625. The feedforwad component signals FF1, FF2 may be output by the compensator 130 on the pair of lines 645, 745, respectively, and applied to the pair of summers 610, 710, respectively. The feedforward component signals FF1, FF2 may have substantially the same frequencies and substantially the same amplitudes, but substantially opposite polarities as the differential distortion component signals DF1, DF2, respectively, that may be introduced by the converter 120, thereby balancing (or canceling) the differential distortion component signals DF1, DF2.

Figure 8:
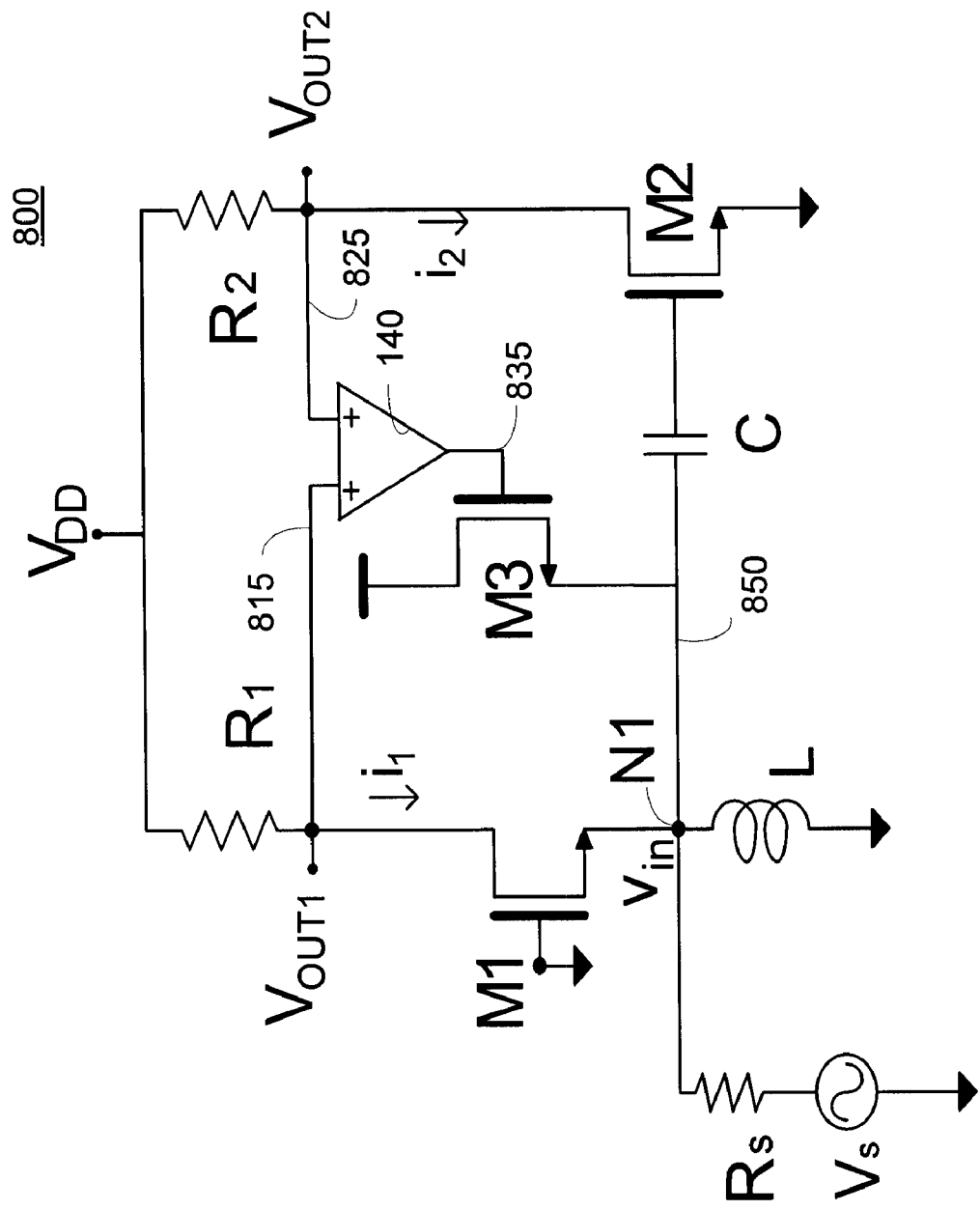
FIG. 8 shows an example of an active conversion circuit according to a still further embodiment of the disclosure.

FIG. 8 shows an example of an active conversion circuit 800 for converting a single ended input signal to a pair of differential signals according to a still further embodiment of the disclosure. The active conversion circuit 800 is arranged so that a signal transfer function of a single ended analog input signal $V_{in}$ remains unaffected.

As seen in FIG. 8, the circuit 800 may be connected at a node N1 to an unbalanced analog signal source $V_s$ through a series resistor $R_s$, which may include an inherent resistance existing in the voltage source $V_s$. The circuit 800 may include a plurality of transistors M1, M2, M3, a pair of resistors $R_1$, $R_2$, an inductor L, a capacitor C, a pair of outputs $V_{OUT1}$, $V_{OUT2}$, a power supply $V_{DD}$, and an extractor 140, all of which may be configured as depicted in the illustration of FIG. 8.

Referring to FIG. 8, a gate terminal of the transistor M1 may be connected to a bias reference voltage, a source terminal of the transistor M1 may be connected to the node N1, and a drain terminal of the transistor M1 may be connected to both the output $V_{OUT1}$ and the power supply $V_{DD}$ (via the resistor $R_1$). Further, a gate terminal of the transistor M2 may be connected to the node N1 through the capacitor C, a source terminal of the transistor M2 may be connected to another reference voltage (which may be the same as or different from the bias reference voltage), and a drain terminal of the transistor M2 may be connected to both the output $V_{OUT2}$ and the power supply $V_{DD}$ (via the resistor $R_2$). The inductor L may be connected between the node N1 and the reference voltage.

Further, the outputs $V_{OUT1}$ and $V_{OUT2}$ of the active conversion circuit 800 may be connected to the extractor 140 through a pair of lines 815, 825. For example, a first input of the extractor 140 may be connected to the output $V_{OUT1}$, one end of the resistor $R_1$, and the drain terminal of the transistor M1 through the line 815. A second input terminal of the extractor 140 may be connected to the second output $V_{OUT2}$, one end of the resistor $R_2$, and the drain terminal of the transistor M2 through the second line 825. An output of the extractor 140 may be connected to a gate terminal of the transistor M3 through a line 835. The source terminal of the transistor M3 may be connected at a point on a line 850 between the node N1 and the gate terminal of the transistor M2. The drain terminal of the transistor M3 may be connected to a reference voltage source, such as, e.g., the power supply $V_{DD}$. The transistor M3 may have an adjustable biasing.

Referring to the waveforms shown in FIG. 2, the conversion circuit 800 may operate in the following manner. The single-ended sinusoidal analog signal $V_{in}$ may be received from the signal source $V_s$ through the node N1. The received single-ended sinusoidal analog signal $V_{in}$ may be applied to the source terminal of the transistor M1 and the gate terminal of the transistor M2 (via the capacitor C). The transistor M1, which has its gate terminal connected to the bias reference voltage, draws a current from the power supply $V_{DD}$ through the resistor $R_1$, thereby causing an in-phase sinusoidal signal $V_{out+}$ to be output at the output $V_{OUT1}$, which has substantially the same frequency and phase as the received signal $V_{in}$. The transistor M2, which has its gate terminal connected to the node N1 through the capacitor C, draws a current $i_2$ from the power supply $V_{DD}$ through the resistor $R_2$, thereby causing an inverted phase sinusoidal signal $V_{out-}$ to be output at the output $V_{OUT2}$. The inverted phase sinusoidal signal $V_{out-}$ has substantially the same frequency, but an opposite phase to that of the input signal $V_{in}$. That is, the inverted phase sinusoidal signal $V_{out-}$ is substantially 180 degrees out of phase with respect to the input signal $V_{in}$.

The operation of the circuit 800 introduces the pair of common mode signals CM1, CM2 at the outputs $V_{OUT1}$, $V_{OUT2}$, respectively. The common mode signals CM1, CM2 may be introduced into the circuit 800 as a result of the operation of the transistor M1. The common mode signals CM1, CM2 have substantially the same phase, substantially the same frequency and substantially the same amplitude. Since the common mode signals CM1, CM2 are substantially the same, a difference between the common mode signals CM1, CM2 is substantially zero. Accordingly, the common mode signals CM1, CM2 may be readily removed, since the signals cancel each other.

Further, the operation of the circuit 800 may introduce an unbalanced even order distortion signal. For example, the transistor M2 may introduce the unbalanced even order differential distortion signal DFA, which may appear at the output $V_{OUT2}$ of the circuit 800. The even order distortion signal DFA may be broken down into the pair of differential component distortion signals DF1, DF2, which have substantially the same frequency and substantially the same amplitude, but substantially opposite polarities. The distortion component signals DF1, DF2 may be caused by, e.g., a current flowing in the transistors M1, M2, which is due to operation of the transistor M2. Accordingly, a difference of the distortion component signals DF1, DF2 results in the even order distortion signal DFA, which has substantially the same frequency and substantially twice the amplitude as either of the distortion component signals DF1 or DF2.

During operation of the active conversion circuit 800, the extractor 140 may add the differential output signals on the lines 815, 825 and extract the differential distortion signal DFA, which may be applied to the gate terminal of the transistor M3. In this regard, the extractor 140 may add the signals on the lines 815, 825 and vary the gain of the result by, e.g., one-half (½) to extract differential distortion signal DF, which may then be used to drive the transistor M3 to generate and inject an adjusted distortion compensating (or mitigating) signal DC into the line 850. The injected distortion compensating signal DC may be adjustably varied by the transistor M3 to have substantially the same frequency and substantially the same amplitude, but an opposite polarity to the distortion signal, thereby balancing (or canceling) the distortion signal DFA.

The extractor 140, with or without the transistor M3, may extract the differential signal DFA by adding the amplified differential output signals on the lines 815, 825. In the instance where the extractor 140 is implemented without the transistor M3, the extractor 140 may further adjustably vary the magnitude of the extract differential signal DFA to provide the distortion compensating signal DC that substantially balance (or cancels) the even order differential distortion signal DFA introduced by, for example, the transistor M2. The even order differential distortion signal DFA may then be injected directly into the line 850.

It is noted that the converter 120 and all of the amplifiers discussed herein, including the differential amplifiers, may have multiple inputs and multiple outputs. For example, the converter 120 disclosed herein may include a differential amplifier configured to include a pair of inputs for receiving a differential signal and a pair of outputs for outputting an amplified differential signal, as shown, e.g., in FIG. 1B or 1C.

It is further noted that while the extractor 140 may include a gain, such as, e.g., one-half (½), or the gain may be variably adjusted to any appropriate value, without limitation.

The present disclosure may have applications in, for example, but not limited to, communication systems, including, without limitation, television communication systems (such as, e.g., satellite TV, CATV, CATV modems, RF TV, etc.), radio communication systems, software defined radio (SDR) communication systems, wireless communication systems (such as, e.g., wireless broadband), and the like.

Figure 9:
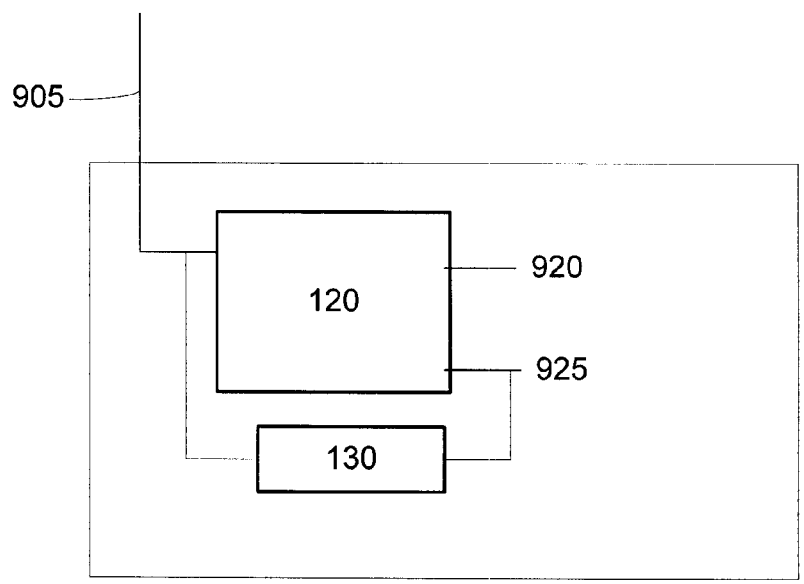
FIG. 9 shows an example of a communication device that includes the conversion circuit according to the disclosure.

FIG. 9 shows an example of a communication device 900 that includes a converter 120 and a compensator 130, according to the disclosure. As seen in FIG. 9, a single ended signal may be received by the converter 120 from a line 905. The converter 120 may convert the single ended signal to an amplified differential signal, which may be output on lines 920 and 925. According to the present disclosure, the compensator 130 substantially cancels (or balances) even order distortion that may be introduced into the differential signal by the converter 120.

The communication device 900 may include, for example, a high definition television (HDTV), a set-top box, or the like. The disclosure may provide the HDTV receiver with an improved second order intercept point IP2, which is an important figure of merit to high definition TVs. The disclosure may provide, e.g., more selectivity in channels by minimizing interference between the available channels, and better reception in low-signal environments, allowing for better and more robust reception of the television channels.

Further, the instant disclosure may be used in any of the following communications systems (including, but not limited to, for example, wired or wireless, single standard or multistandard, and broadband or wideband systems), to improve the performance of the communication system, including, but not limited to, for example, a radio communication system, a satellite communication system, a wireless communication system, a multi-standard communication system, a software defined radio (SDR) communication system, WiFi communication system, a telephone communication system, a professional land mobile radio (LMR) communication system, a specialized mobile radio (SMR) communication system, a general mobile radio service (GMRS) communication system, or the like.

While the disclosure has been described in terms of example embodiments, those skilled in the art will recognize that the disclosure can be practiced with switchable modifications in the spirit and scope of the appended claims. These examples given above are merely illustrative and are not meant to be an exhaustive list of all possible designs, embodiments, applications or modifications of the disclosure.

What is claimed is:

1. A method for mitigating second order distortion when converting a single ended signal to a pair of differential signals, the method comprising:
receiving a single ended signal;
converting the single ended signal to a pair of differential signals; and
providing an adjusted distortion compensating signal to only one of the pair of differential signals to substantially cancel an even order distortion signal injected to at least one of the pair of differential signals during the conversion of the single ended signal to the pair of differential signals.

2. The method of claim 1, further comprising:
adding the pair of differential signals to extract a differential distortion signal.

3. The method of claim 2, further comprising:
varying a magnitude of the differential distortion signal by a predetermined gain value to generate the adjusted distortion compensating signal.

4. The method of claim 2, further comprising:
generating a compensating level signal based on the adding of the pair of differential signals.

5. The method of claim 3, wherein the predetermined gain value is a one-half gain.

6. The method of claim 4, wherein the adjusted distortion compensating signal is based on the compensating level signal.

7. The method of claim 4, wherein the adjusted distortion compensating signal comprises the compensating level signal.

8. The method of claim 1, wherein a signal transfer function of the single ended signal is unaffected by the converting.

9. The method of claim 1, further comprising:
maintaining a loop gain at substantially equal to zero.

10. The method of claim 1, further comprising:
maintaining substantial linearity between the pair of differential signals and the single ended signal.

11. A conversion circuit comprising:
an input terminal configured to receive a single ended signal;
a converter configured to convert the single ended signal to a pair of differential signals, the pair of differential signals comprising a first differential signal and a second differential signal;
a compensator configured to compensate only the first differential signal by cancelling an even order differential distortion signal therein; and
an output terminal configured to output the compensated first differential signal.

12. The conversion circuit of claim 11, wherein the compensator comprises:
a compensation signal generator configured to generate a distortion compensation signal based on the pair of differential signals; and
an adder configured to add the distortion compensation signal to the first differential signal to generate the compensated first differential signal.

13. The conversion circuit of claim 12, wherein the output terminal is the first output terminal, and
the conversion circuit further comprises a second output terminal configured to output the second differential signal.

14. The conversion circuit of claim 12, wherein the compensation signal generator comprises an extractor configured to add the first differential signal and the second differential signal.

15. The conversion circuit of claim 14, wherein the extractor is further configured to generate the differential distortion signal based on the adding of the first differential signal and the second differential signal.

16. The conversion circuit of claim 15, wherein the extractor is further configured to generate the distortion compensation signal based on the differential distortion signal.

17. The conversion circuit of claim 16, wherein the extractor is further configured to adjust a gain of the differential distortion signal to generate the distortion compensation signal.

18. The conversion circuit of claim 17, wherein the extractor reduces the gain of the differential distortion signal by one half.

19. The conversion circuit of claim 14, wherein the extractor is further configured to output a compensation level signal based on the adding of the first differential signal and the second differential signal.

20. The conversion circuit of claim 19, wherein the compensation signal generator further comprises a gain adjuster configured to adjust a gain of the compensation level signal and output the distortion compensation signal.

21. The conversion circuit of claim 20, wherein the gain adjuster comprises at least one of a regulating amplifier and a linearizing amplifier.

22. The conversion circuit of claim 11, wherein the even order differential distortion signal comprises a pair of differential distortion component signals having substantially a same amplitude and frequency and opposite polarities.

23. The conversion circuit of claim 22, wherein the gain adjuster comprises at least one of a regulating amplifier and a linearizing amplifier.

24. The conversion circuit of claim 13, wherein the even order differential distortion signal comprises a pair of differential distortion component signals having substantially a same amplitude and frequency and opposite polarities.

* * * * *